(12) United States Patent
Watanabe et al.

(10) Patent No.: US 7,107,826 B2
(45) Date of Patent: Sep. 19, 2006

(54) SCANNING PROBE DEVICE AND PROCESSING METHOD BY SCANNING PROBE

(75) Inventors: Naoya Watanabe, Chiba (JP); Osamu Takaoka, Chiba (JP)

(73) Assignee: SII NanoTechnology Inc., (JP)

( * ) Notice: Subject to any disclaimer, the term of this patent is extended or adjusted under 35 U.S.C. 154(b) by 0 days.

(21) Appl. No.: 11/096,875

(22) Filed: Apr. 1, 2005

(65) Prior Publication Data

US 2005/0223785 A1 Oct. 13, 2005

(30) Foreign Application Priority Data

| Apr. 9, 2004 | (JP) | ............................. 2004-115180 |
| Mar. 4, 2005 | (JP) | ............................. 2005-060111 |

(51) Int. Cl.
*H01J 37/352* (2006.01)
(52) U.S. Cl. ........................................................ 73/105
(58) Field of Classification Search ................... 73/105
See application file for complete search history.

(56) References Cited

U.S. PATENT DOCUMENTS

| 5,949,070 A | * | 9/1999 | Gamble .................... 250/306 |
| 6,075,585 A | * | 6/2000 | Minne et al. ................. 355/71 |
| 6,255,469 B1 | * | 7/2001 | Seeman et al. ............ 536/23.1 |
| 6,827,979 B1 | * | 12/2004 | Mirkin et al. ............... 427/256 |

* cited by examiner

*Primary Examiner*—Robert Raevis
(74) *Attorney, Agent, or Firm*—Adams & Wilks

(57) ABSTRACT

There is provided a device in which a probe can be used for both of observation and correction, and which can, even if a next generation photomask of ultra minute structure is made an object, perform a desired processing without injuring a normal portion in a process of obtaining information of a position and a shape of a defect part, and without impairing the probe also at a processing time. It has been adapted such that, at an observation time, a contact pressure between a probe and a mask is reduced to 0.1 nN by applying a vibration of 1 kHz to 1 MHz to the probe. It has been adapted such that a cantilever used in the present invention is formed by a silicon material of 100–600 μm in length and 5–50 μm in thickness and, at the observation time, the probe contacts with the mask at the contact pressure of 0.1 nN and, at the processing time, a defect correction can be performed by causing the probe to contact with the mask at the contact pressure of 10 nN to 1 mN.

23 Claims, 2 Drawing Sheets

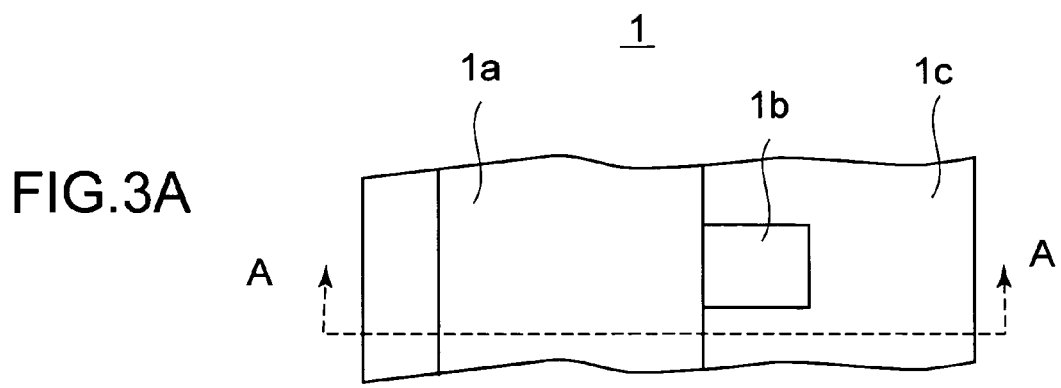
FIG. 3A
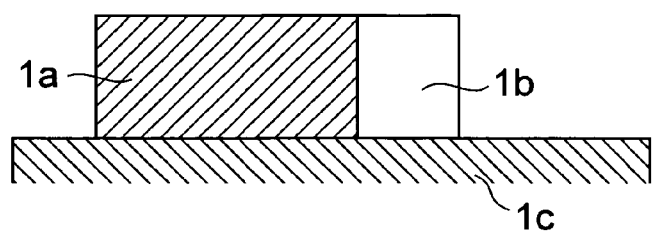
FIG. 3B
FIG. 4A
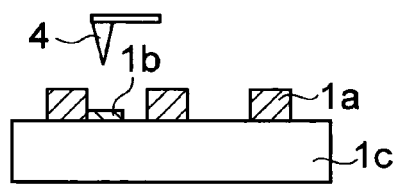
FIG. 4D
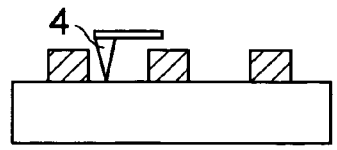
FIG. 4B
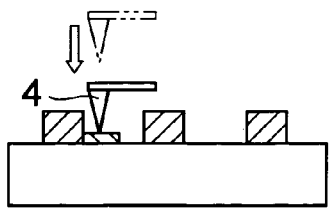
FIG. 4E
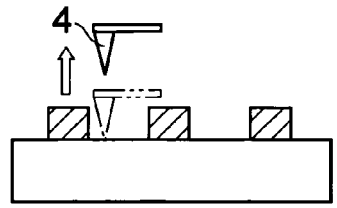
FIG. 4C
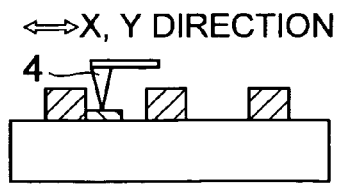
FIG. 4F
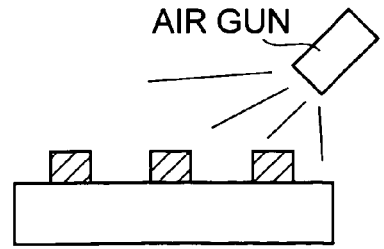

SCANNING PROBE DEVICE AND PROCESSING METHOD BY SCANNING PROBE

BACKGROUND OF THE INVENTION

1. Field of the Invention

The present invention relates to a scanning probe device and a processing method using a scanning probe which processes shape information of a sample surface or the sample surface. Especially, it is one for performing a correction which removes an excess residue, such as a black residue, of a semiconductor photomask.

2. Description of the Related Art

Heretofore, for a black residue correction of a photomask used in a semiconductor manufacture, there has been adopted a method of sputter etching or gas assist etching, which uses a focused ion beam (FIB).

The black residue is one in which, as shown in FIG. 3A and FIG. 3B, an opaque material adheres to a portion where there is no opaque film in a design of the photomask, such as a boundary part of a normal pattern 1a in a photomask 1 in which the pattern has been formed on a glass substrate by an opaque film of Cr or MoSi etc., thereby becoming a defect part 1b.

Although FIB processing is an excellent processing method that can perform a minute processing because a processing region for the correction is limited to an FIB irradiation spot, there has become presented a problem that ions of gallium etc. are implanted into the glass substrate of the photomask by irradiating the ion beam, thereby causing such damage as deteriorating transparency.

Further, as a prior art, besides the correcting method by the FIB, there is presented a method of scraping the defect part off by rubbing it with a sharp needle.

For example, in published application no. JP-A-6-148870, there is disclosed a method of correcting a photomask having a phase shift layer, whose goal is to provide a method capable of simply and accurately correcting a protruding residue defect of the photomask having the phase shift layer, and in which the transparent protruding residue on the phase shift layer or on a glass substrate is physically removed by scratching it with a minute probe having a sharp tip. However, if it is attempted to perform this method, first there is required a measurement by a scanning electron microscope (SEM) or a laser microscope in order to specify information of a position and a shape of the defect part. Subsequently, on the basis of the defect position information, the minute probe whose tip is sharp is moved to the defect position, and an operation of rubbing and scraping a defect region is performed. It is not easy to perform these series of operations, and a concrete technique for realizing them is not disclosed. Moreover, in this method, since a probe of a stylus system shape measuring instrument is used as the minute probe whose tip is sharp, a tip of the stylus becomes considerably large with respect to the black residue, so that it is difficult to cause the stylus to contact with the defect part. Further, in a case where it is contacted with a transparent portion of the glass substrate of the normal photomask, a normal portion of the glass substrate surface is damaged, thereby becoming a factor of reducing a light transmittance.

Further, in published application no. JP-A-2003-43669, there is disclosed a technique in which a scanning probe microscope (SPM) has been adopted as a defect correcting means. This technique is one whose object is to provide a method of correcting the defect of the photomask and an SPM used therein, in which there is no damage to a quartz substrate and a portion other than the defect after correcting a remaining defect formed in the photomask like a correction by the laser beam irradiation and an FIB sputtering, which can accurately remove the remaining defect not larger than 500 nm, and additionally which can easily detect an end point of the correction. A photomask defect correcting method using this technique is explained by using FIG. 4A–FIG. 4F. As shown in FIG. 4A, the mask is set to the scanning probe microscope, and a probe 4 is moved by a moving means such that a tip of the probe 4 becomes just above a remaining defect 1b. Next, as shown in FIG. 4B, the tip of the probe 4 is approached to a position where it contacts with the remaining defect 1b. Next, as shown in FIG. 4C, while scanning the probe in X- and Y-directions only in a region of the remaining defect 1b, the defect is scraped off by pressing the probe 4 down to thereby apply a load to the defect and scratching it. Next, as shown in FIG. 4D, when the tip of the probe 4 has reached a quartz substrate 1c, the pressing down and the scanning in the X- and Y-directions of the probe 4 are stopped. Next, as shown in FIG. 4E, the probe 4 is separated from a mask pattern and, finally as shown in FIG. 4F, the defect correcting method for the photomask is finished by blowing clean air by a clean air gun to thereby completely remove shavings from the mask.

In this practice, since the probe of the SPM is adopted as the defect correcting means, it follows that the information of the position and the shape of the defect part can be obtained by this SPM itself and the defect correction is performed by that probe, so that there is no difficulty in moving, based on the information of the defect position and its region, the probe to the defect region like in the above published application no. JP-A-6-148870.

However, in a silicon material that is the conventional probe of the SPM used in an atomic force microscope (AFM), it has been a problem that, by the fact that the defect part is scraped, a wear of the tip of the probe is severe, thereby generating a breakage and the like. For example, even a probe coated by diamond-like carbon formed by CVD wears or chips.

When obtaining the information of the shape of the photomask by using diamond for the stylus in order to increase strength of the probe, there is a problem that a normal portion of the glass substrate and the like of the photomask is damaged.

Further, in a case where a cantilever using a silicon-based probe for observation and a probe of diamond for correction is replaced, since a time is required in a positional alignment of tips of both probes, and the like, there has been a problem that a processing efficiency is extremely reduced.

SUMMARY OF THE INVENTION

Objects of the invention are to solve the above problems, and provide a black residue correcting method for a photomask and a scanning probe device, each of which can, when obtaining the shape information of the photomask surface, perform a desired correction without injuring a normal portion of the photomask and without breaking the probe also when correcting a defect region.

The invention provides a processing method by a scanning probe, which processes a shape information of a sample surface or a sample by causing a probe to approach to or contact with the sample surface, characterized by having a step of obtaining a three-dimensional shape information of the sample by vibrating a cantilever having in its tip the probe in a vertical direction with respect to the sample surface and scanning the sample surface while retaining a 1st contact pressure that the probe applies to the sample surface, a step of moving the cantilever to a predetermined position on the basis of the three-dimensional shape information, performing a 2nd vibration to the cantilever in the vertical direction with respect to the sample surface, and giving a 2nd contact pressure that the probe applies to the sample surface, and a step of removing a predetermined portion of the sample by scanning a predetermined region of the sample surface by the probe on the basis of the three-dimensional shape information while maintaining the 2nd vibration and the 2nd contact pressure.

Or, the invention provides a processing method by a scanning probe, which processes a shape information of a sample surface or a sample by causing a probe to approach to or contact with the sample surface, characterized by having a step of obtaining a three-dimensional shape information of the sample by vibrating a cantilever having in its tip the probe in a vertical direction with respect to the sample surface and scanning the sample surface while retaining a 1st contact pressure that the probe applies to the sample surface, a step of moving the cantilever to a predetermined position on the basis of the three-dimensional shape information, and giving a 2nd contact pressure that the probe applies to the sample surface, and a step of removing a predetermined portion of the sample by scanning a predetermined region of the sample surface by the probe on the basis of the three-dimensional shape information while maintaining the 2nd contact pressure under a state that the cantilever is not vibrated with respect to the sample surface.

Further, the invention provides a scanning probe device which processes a shape information of a sample surface or a sample by causing a probe to approach to or contact with the sample surface, characterized by possessing a sample base on which the sample is disposed, a moving means which possesses a cantilever having in its tip the probe above the sample and moves the cantilever with the cantilever being fixed to a tip, and a displacement detection means which detects a displacement of the cantilever, and in that the cantilever is 100–600 µm in length, 5–50 µm in thickness, and formed by a silicon material.

According to the scanning probe device and the processing method by the scanning probe, which concern the invention, a damage exerted on the normal portion of the photomask by the probe at an observation time is reduced and, at a correction time, the defect can be removed by applying a suitable pressing pressure to the defect portion and it is possible to prevent the breakage of the probe, and the like.

BRIEF DESCRIPTION OF THE DRAWINGS

FIG. 3A is a plan view for explaining the black residue of the photomask;

FIG. 3B is a sectional view for explaining the black residue of the photomask; and FIG. 4A–FIG. 4F are views for explaining a conventional method of correcting the black residue of the photomask.

DESCRIPTION OF THE PREFERRED EMBODIMENT

Figure 1:
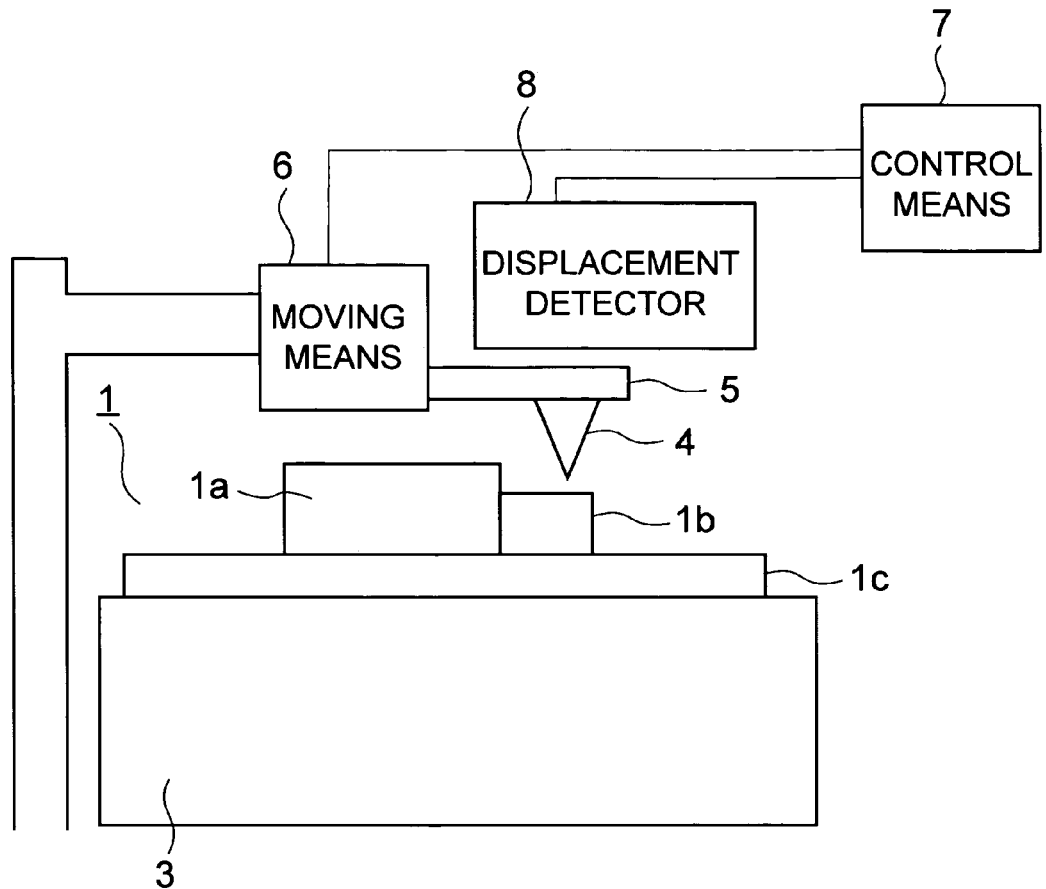
FIG. 1 is a view showing a constitution of a scanning probe device for correcting a black residue of a photomask, which concerns the invention.

In FIG. 1, there is shown a constitution of one example of a scanning probe device concerning the invention.

As to a sample 1, a photomask in which there is a black residue 1b adjacent to a normal pattern 1a on a glass substrate 1c is explained as one example.

The sample 1 is disposed on a sample base 3 comprising an XYZ stage for moving the sample 1.

A probe 4 of single crystal diamond is attached to a moving means 6 through a cantilever 5, with the probe 4 being provided at the free end of the cantilever 5, and the moving means 6 is three-dimensionally drive-controlled by a control means 7. In the present embodiment, the moving means 6 comprises a three-dimensional actuator using a piezoelectric element.

A displacement detection means 8 is provided for detecting a displacement of the cantilever 5 by an interaction between the probe 4 and the sample 1. As the displacement detection means 8, there is used an optical lever method in which a semiconductor laser is irradiated to the cantilever and its reflected light is detected by a light detector, thereby detecting the displacement of the cantilever by the interaction between a tip of the probe and a surface of the sample. Here, a detected signal is sent to the control means 7, the probe 4 is moved by moving the moving means 6 in a vertical direction (up-and-down directions) with respect to the sample surface such that the displacement of the cantilever becomes constant, and this information that moves the moving means 6 in the vertical direction becomes a shape information of the sample surface.

A processing method by a scanning probe, which concerns the invention, is explained below.

First, a step of obtaining a three-dimensional shape information of the sample surface is performed by, as a 1st vibration, vibrating the probe 4 in a first vibration mode, for example, at 1 kHz to 1 MHz, vertically to the surface of the sample 1 by the moving means 6, while causing the probe 4 to approach to the sample 1 by the moving means 6, making the tip of the probe 4 into a state that it is approached to and separated from the sample 1 surface, making a 1st contact pressure when the probe 4 contacts with the sample 1 surface of 0.1 nN, and scanning the sample 1 surface while the probe 4 applies the 1st contact pressure to the sample 1 surface.

Incidentally, by comparing the obtained three-dimensional information with a design information of the photomask, a defect region may be discriminated and stored.

Next, in a case where there is a defect place, there is performed a step of moving, from the three-dimensional shape information, the probe 4 to a position of the defect by the moving means 6. In the present embodiment, the probe 4 has been moved under a state of being spaced from the sample 1, but it may be moved under the state of the 1st contact pressure 0.1 nN.

Next, under a state that, as a 2nd vibration, the probe 4 is vibrated in a second vibration mode, for example, at 100 to 1000 Hz, vertically to the surface of the sample 1 by the moving means 6, there is performed a step of applying a 2nd contact pressure at 10 nN to 1 mN to the sample 1.

Additionally, by scanning the defect region of the sample 1 surface, obtained from the three-dimensional shape information by the probe 4, there is performed a step of removing a portion of the sample in a predetermined region corresponding to a defect portion.

Incidentally, in addition to the black residue correcting method for the photomask in the present embodiment, a step of obtaining the three-dimensional shape information of the sample surface from which the defect region has been removed may be performed by, while vibrating the probe 4 vertically with respect to the surface of the sample 1 by the moving means 6, additionally causing the probe 4 to approach to the sample 1 by the moving means 6, making the tip of the probe 4 into the state that it is approached to and separated from the sample 1 surface, making the 1st contact pressure when the probe 4 contacts with the sample 1 surface into 0.1 nN, and scanning the sample 1 surface.

Additionally, in the present embodiment, although the moving means has been used in order to vibrate the probe, the probe may be vibrated by a vibrator, such as piezoelectric element, independent from the moving means.

Further, in the present embodiment, although the probe 4 has been vibrated when performing the step of causing it to contact with the sample 1 at the 2nd contact pressure of 10 nN to 1 mN, it may be made into a non-vibrated state and under this state there may be performed the step of removing the member in the predetermined region which is the defect portion, that is the next step.

Incidentally, silicon is used as a material of the cantilever 5, and the contact pressure 0.1 nN can be controlled by using one which is 100–600 μm in length, and 5–50 μm in thickness.

Figure 2:
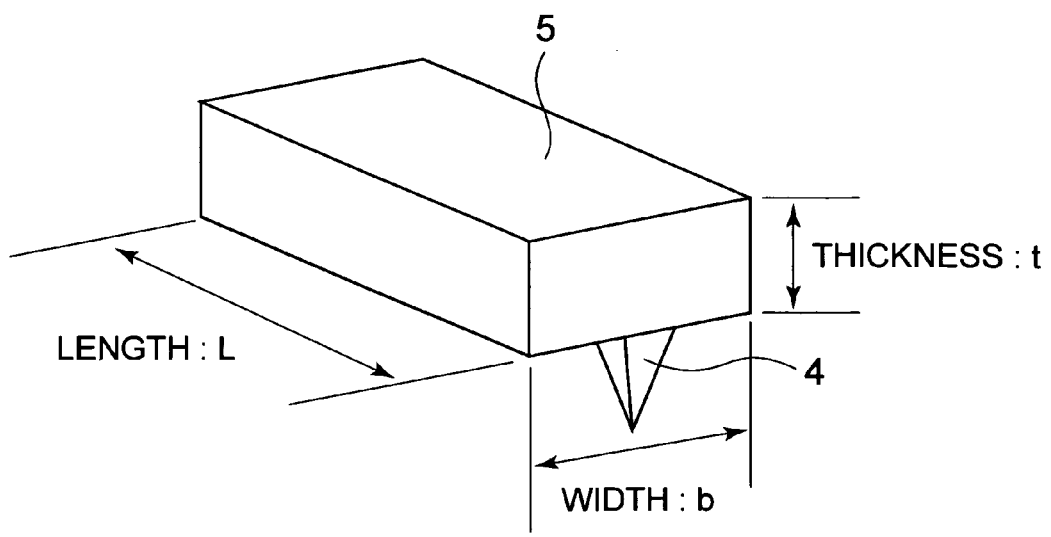
FIG. 2 is a perspective view for explaining a dimension of a cantilever portion concerning the invention.

A cantilever portion having been used in the present embodiment is shown in FIG. 2. The probe 4 is single crystal diamond having a shape whose tip is sharp, a material of the cantilever 5 is silicon, and there has been used one which is 600 μm in length (L), 120 μm in width (b), and 30 μm in thickness (t). In a case of this cantilever, a spring constant becomes k=626 N/m.

Incidentally, dimensions of the length, the thickness and the width of this cantilever 5 are not limited to the above dimensions, further its material is not limited to silicon as well, and it may be such a material as SUS, SiNx, and SiO2 for instance.

What is claimed is:

1. A processing method by a scanning probe, which processes a shape information of a sample surface or a sample by causing a probe to approach to or contact with the sample surface, the processing method comprising:
    a step of obtaining a three-dimensional shape information of the sample by performing a 1st vibration to a cantilever having at its free end the probe in a vertical direction with respect to the sample surface and scanning the sample surface while retaining a 1st contact pressure that the probe applies to the sample surface; and
    a step of removing a predetermined portion of the sample by scanning a predetermined region of the sample surface by the probe on the basis of the three-dimensional shape information while performing a 2nd vibration to the cantilever in the vertical direction with respect to the sample surface, which is different from the 1st vibration, and giving a 2nd contact pressure greater than the 1st contact pressure that the probe applies to the sample.

2. A processing method by a scanning probe according to claim 1; further comprising, after the step of removing the predetermined portion of the sample, a step of scanning the sample surface while retaining a vibration to the cantilever in a vertical direction with respect to the sample surface and at the 1st contact pressure to obtain a three-dimensional position information of the predetermined portion of the sample.

3. A processing method by a scanning probe according to claim 1; wherein in the step of obtaining a three-dimensional shape information of the sample, the 1st vibration of the cantilever in the vertical direction with respect to the sample surface is 1 kHz to 1 MHz.

4. A processing method by a scanning probe according to claim 1; wherein the 2nd vibration of the cantilever in the vertical direction with respect to the sample surface is 100 to 1000 Hz.

5. A processing method by a scanning probe according to claim 1; wherein the 1st contact pressure is 0.1 nN, and the 2nd contact pressure is 10 nN to 1 mN.

6. A processing method by a scanning probe according to claim 1; wherein the 2nd contact pressure is 10 nN to 1 mN.

7. A processing method by a scanning probe according to claim 1; wherein the cantilever is 100–600 μm in length, 5–50 μm in thickness, and formed of a silicon material.

8. A processing method by a scanning probe according to claim 1; wherein the sample is a photomask, and a black residue of the photomask is corrected by removal of the predetermined portion of the sample.

9. A method of processing a sample, comprising the steps of:
    providing a cantilever having a probe at a free end thereof;
    obtaining three-dimensional shape information of a sample by vibrating the cantilever in a first vibration mode in up-and-down directions relative to the sample and scanning the probe relative to the sample while the probe applies a first contact pressure to the sample; and
    removing a predetermined portion of the sample by scanning a predetermined region thereof by the probe based on the three-dimensional shape information while vibrating the cantilever in a second vibration mode, which is different from the first vibration mode, in up-and-down directions relative to the sample and while the probe applies a second contact pressure greater than the first contact pressure to the predetermined region of the sample.

10. A method according to claim 9; further comprising, after the removing step, obtaining three-dimensional shape information of the sample by vibrating the cantilever in the first vibration mode in up-and-down directions relative to the sample and scanning the probe relative to the sample while the probe applies the first contact pressure to the sample.

11. A method according to claim 10; wherein the first vibrating mode is within the range 1 kHz to 1 MHz.

12. A method according to claim 11; wherein the second vibrating mode is within the range 100 to 1000 Hz.

13. A method according to claim 10; wherein the second vibrating mode is within the range 100 to 1000 Hz.

14. A method according to claim 10; wherein the first contact pressure is 0.1 nN.

15. A method according to claim 14; wherein the second contact pressure is within the range 10 nN to 1 mN.

16. A method according to claim 10; wherein the second contact pressure is within the range 10 nN to 1 mN.

17. A method according to claim 9; wherein the first vibrating mode is within the range 1 kHz to 1 MHz.

18. A method according to claim 17; wherein the second vibrating mode is within the range 100 to 1000 Hz.

19. A method according to claim 9; wherein the second vibrating mode is within the range 100 to 1000 Hz.

20. A method according to claim 9; wherein the first contact pressure is 0.1 nN.

21. A method according to claim 20; wherein the second contact pressure is within the range 10 nN to 1 mN.

22. A method according to claim 9; wherein the second contact pressure is within the range 10 nN to 1 mN.

23. A method according to claim 9; wherein the sample is a photomask, and the predetermined portion of the sample being removed is a residue defect of the photomask.

* * * * *